United States Patent
Lin

(10) Patent No.: US 8,922,987 B2
(45) Date of Patent: Dec. 30, 2014

(54) SERVER STRUCTURE WITH SWAPPABLE TRAY

(75) Inventor: Te-Chang Lin, San Jose, CA (US)

(73) Assignee: Super Micro Computer Inc., San Jose, CA (US)

( * ) Notice: Subject to any disclaimer, the term of this patent is extended or adjusted under 35 U.S.C. 154(b) by 332 days.

(21) Appl. No.: 13/327,754

(22) Filed: Dec. 16, 2011

(65) Prior Publication Data

US 2013/0155604 A1 Jun. 20, 2013

(51) Int. Cl.
*H05K 7/14* (2006.01)
*G06F 1/18* (2006.01)

(52) U.S. Cl.
CPC .................................. *G06F 1/187* (2013.01)
USPC .................... 361/679.33; 312/223.1

(58) Field of Classification Search
CPC ....... G06F 3/0689; G06F 1/26; G06F 19/321; G06F 1/188; G06F 1/16; G06F 1/1601; G06F 1/181; G06F 1/184; G06F 1/187; G06F 1/20; G06F 1/185; G06F 1/30; G06F 1/183; G06F 1/189; G06F 1/3287; G06F 1/203; G06F 1/3268; G06F 3/0674; H05K 1/0213; H05K 7/1488; H05K 13/00; H05K 7/1411; H05K 7/20581; H05K 7/20727; H05K 7/1487; H05K 7/20809; H05K 7/1492; H05K 7/20736; H05K 9/0041; H05K 7/1421; H05K 7/1425; H05K 7/1489; H05K 7/1491; H05K 7/20136; H05K 7/20172; H05K 7/20209; H05K 7/20236; H05K 7/20281; H05K 7/20772

USPC ............. 361/679.01, 679.02, 679.33–679.39, 361/724–727; 312/223.1–223.2
See application file for complete search history.

(56) References Cited

U.S. PATENT DOCUMENTS

| | | | | |
|---|---|---|---|---|
| 6,661,656 | B2 * | 12/2003 | Kim et al. | 361/679.33 |
| 7,068,498 | B2 * | 6/2006 | Bolich et al. | 361/752 |
| 7,394,660 | B2 * | 7/2008 | Hidaka | 361/727 |
| 7,627,005 | B2 * | 12/2009 | Peeke | 370/532 |
| 7,839,624 | B2 * | 11/2010 | Lin | 361/679.02 |
| 2002/0122296 | A1 * | 9/2002 | Stone et al. | 361/687 |
| 2005/0231923 | A1 * | 10/2005 | Peng et al. | 361/754 |
| 2007/0285887 | A1 * | 12/2007 | Chang | 361/687 |
| 2013/0141863 | A1 * | 6/2013 | Ross et al. | 361/679.33 |

* cited by examiner

*Primary Examiner* — Anthony Haughton
*Assistant Examiner* — Ingrid Wright
(74) *Attorney, Agent, or Firm* — Chun-Ming Shih; HDLS IPR Services

(57) ABSTRACT

A server structure with a swappable tray includes a chassis housing, two power supply devices and a plurality of motherboard trays, and the chassis housing has two parallel motherboard areas, and each motherboard area has a power slot formed at a rear section and a plurality of tray slots at a front section, and each power slot is formed at the same position of each motherboard area, and each power supply device is plugged into each respective power slot, and each motherboard tray is in the same shape and has a motherboard, and each motherboard tray has an opening and a storage unit set installed through the opening, and each motherboard tray can be swapped and plugged into any one of the tray slots. Therefore, the motherboard tray can be installed freely at any position according to the using requirement, so as to improve the overall functionality and convenience.

10 Claims, 8 Drawing Sheets

8,922,987 B2

SERVER STRUCTURE WITH SWAPPABLE TRAY

FIELD OF THE INVENTION

The present invention relates to an industrial computer, in particular to a server structure with a swappable tray applied in a server.

BACKGROUND OF THE INVENTION

As the computer industry advances, companies rely more and more on industrial computer systems, and corporate requirements of a server system become increasingly higher. To cope with the growth of a company, many companies integrate a number of servers to satisfy the requirements for huge data volume and network flow and allow expansions and updates of the server system in the future.

In general, a server is usually turned on for a long time, and companies usually require maintaining, repairing or replacing a hardware component without turning off the server system when any hardware component of the server system breaks down. Therefore, a conventional plug-in server is introduced, wherein the design of a single central back panel is provided for connecting separate hard disk area, motherboard area and power supply area.

However, the plug-in server has the following drawbacks. The server only allows a defined or designed motherboard to be installed, and the quantity and model of the hard disk must be defined in advance. As a result, the motherboard and the hard disk cannot be replaced freely by those with a different specification to meet different application requirements. In addition, the motherboard and the hard disk are installed on both sides of the central back panel, so that use on one side of the server is inconvenient for users to plug or unplug the motherboard or the hard disk, and the functions and effects of using the server are limited. In view of the aforementioned drawbacks of the conventional plug-in server, the inventor of the present invention based on years of experience in the related industry to conduct researches and experiments, and finally developed a server structure to overcome the drawbacks of the prior art.

SUMMARY OF THE INVENTION

The present invention is to provide a server structure with a swappable tray, wherein a motherboard tray is provided for including and integrating a hard disk area, and a standard interface is used for connecting a power supply device, so that users can replace the design or specification of a motherboard tray according to different using requirements, and the motherboard tray can be plugged freely into any position to achieve the effect of a swappable tray, so as to improve the functionality and convenience.

Accordingly, the present invention provides a server structure with a swappable tray, comprising: a chassis housing, having two parallel motherboard areas, each having a power slot formed at a rear section of the motherboard area and a plurality of tray slots formed at a front section of the motherboard area, wherein the power slots are formed separately at the same position of each of the motherboard areas; two power supply devices, plugged into the power slots respectively; and a plurality of motherboard trays, each having the same shape and a motherboard installed thereon, wherein each of the motherboard trays has an opening and a storage unit set installed through the opening, and each of the motherboard tray is plugged into each respective tray slot, and the motherboard and the storage unit set are respectively and electrically coupled to the power supply devices, wherein each of the motherboard trays can be swapped and plugged into any one of the tray slots.

The present invention further has the following effects. The motherboard and the storage unit set are installed on the motherboard tray, such that the motherboard and the storage unit set have the hot swap function. In addition, each power slot is formed at the same position of each motherboard area, and each motherboard tray has the same shape, so that the manufacturing cost can be lowered by using a same mold for manufacturing the motherboard trays. In the meantime, each motherboard tray can be plugged selectively into a tray slot at a left, right, upper or lower position, and manufacturers can change the position of the server to facilitate customers to manage the types of servers, so as to improve the functionality and convenience of the server structure of the present invention. In addition, the storage unit set is installed at an open end of the motherboard tray to facilitate manufacturers to install, change, maintain or repair the storage unit set. Each storage unit set includes six 2.5-inch hard disks, such that the server structure of the present invention has the feature of a large storage space. In addition, each motherboard tray has a detachable I/O socket base exposed from the chassis housing to enhance the expandability of the server structure of the present invention. Further, the flexible pulling ring is made of rubber to facilitate users to pull the pulling ring out from the tray slot to improve the convenience of the server structure of the present invention.

DESCRIPTION OF THE PREFERRED EMBODIMENTS

The technical characteristics and contents of the present invention will become apparent with the following detailed description and related drawings. The drawings are provided for the purpose of illustrating the present invention only, but not intended for limiting the scope of the invention.

With reference to FIGS. 1 to 8 for a server structure with a swappable tray in accordance with the present invention, the server structure comprises a chassis housing 1, two power supply devices 2 and a plurality of motherboard trays 3.

Figure 1:
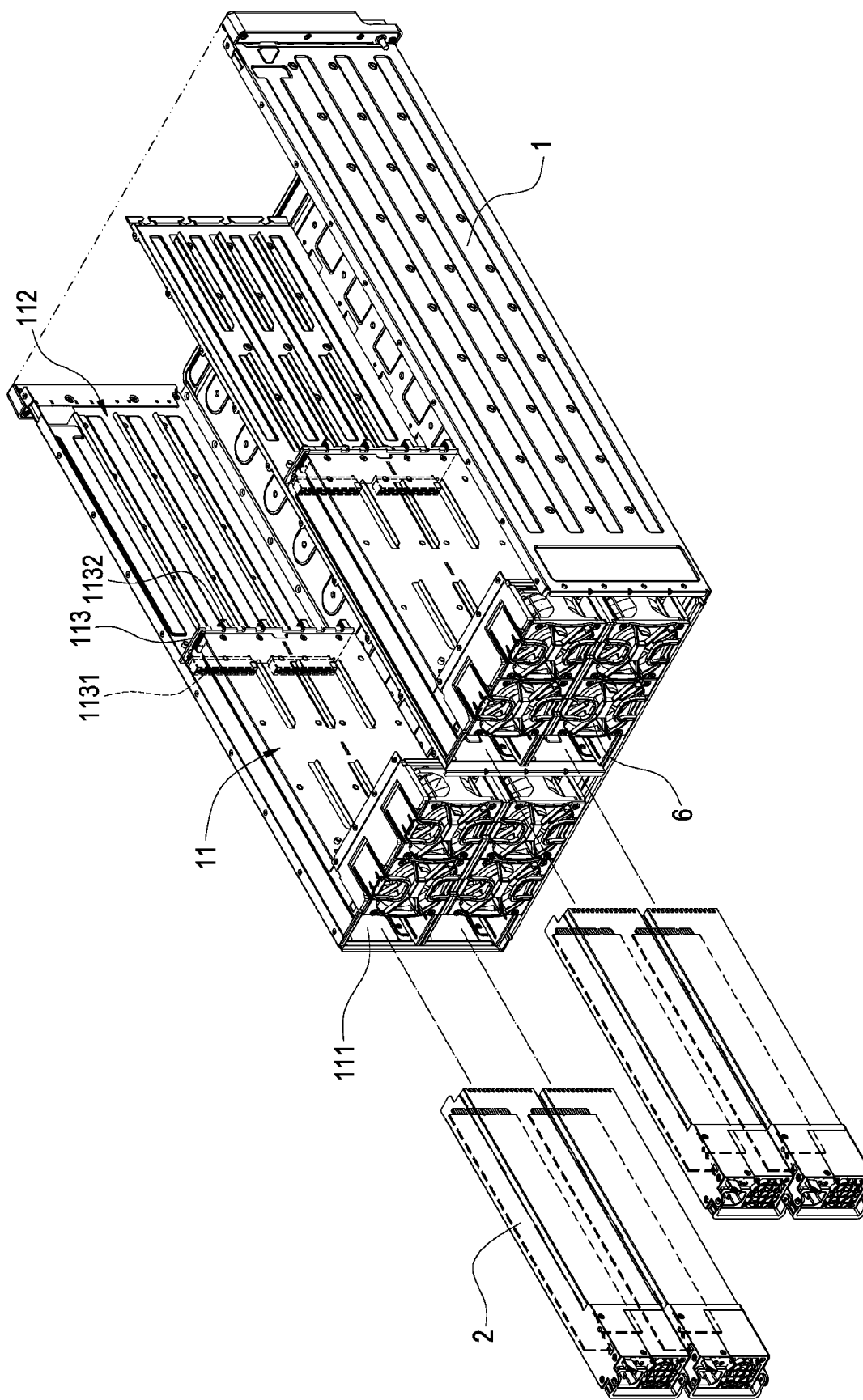
FIG. 1 is an exploded view of a server structure of the present invention.
Figure 2:
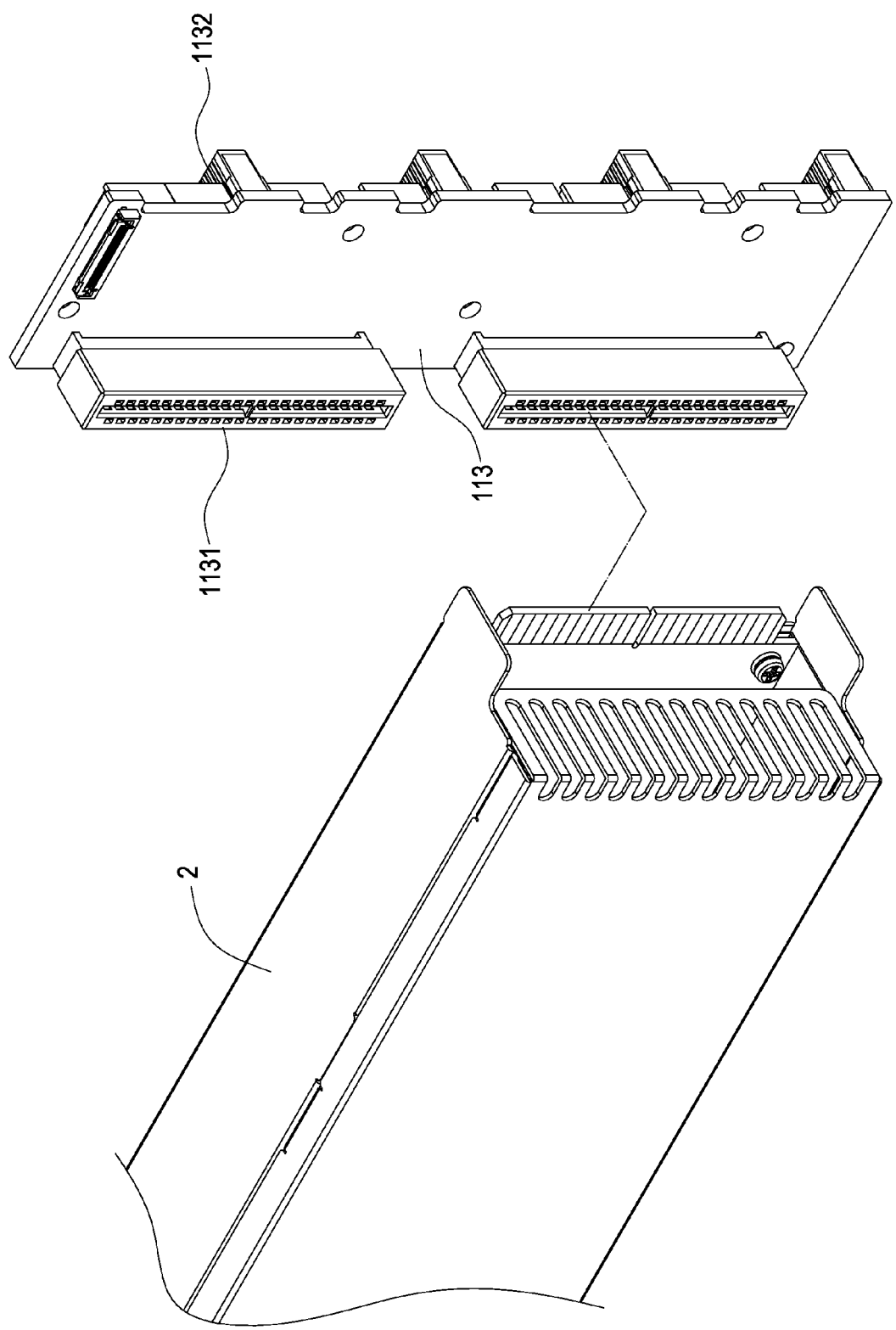
FIG. 2 is partial close-up view of a server structure of the present invention.
Figure 3:
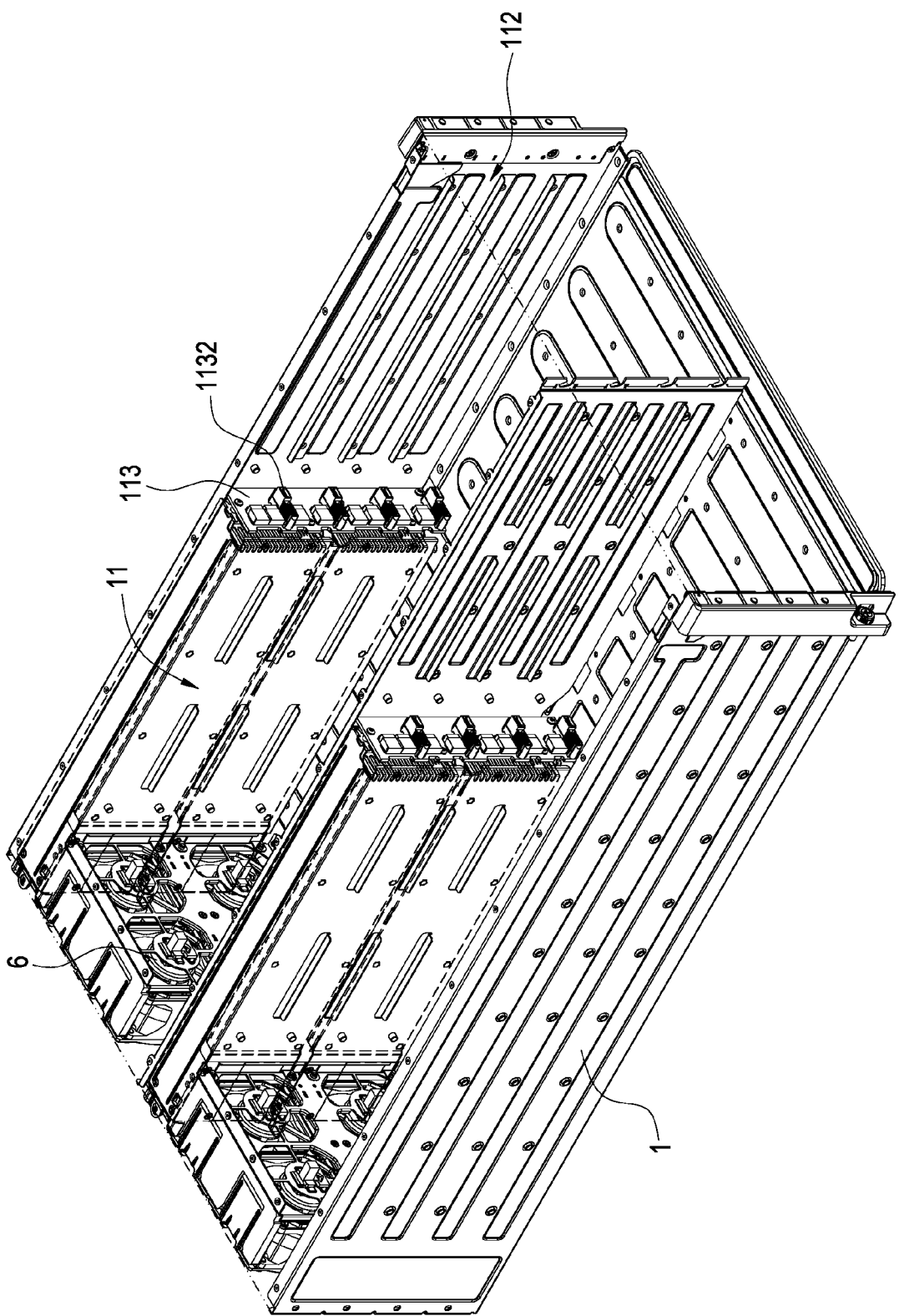
FIG. 3 is a perspective view of a server structure of the present invention.

The chassis housing 1 includes at least two parallel motherboard areas 11, wherein the chassis housing 1 of a preferred embodiment as shown in FIG. 1 has two parallel rows of four motherboard areas 11, and each motherboard area 11 has a power slot 111 formed at a rear section of each motherboard area 11 and a plurality of tray slots 112 formed at a front section of each motherboard area 11, and the power slots 111 are formed separately at the same position of each motherboard area 11. In addition, a partition 113 is formed between the power slots 111 and the tray slots 112 and has a power supply socket 1131 on a side of the partition 113 and corresponding to the power slot 111, and a plurality of power transmission sockets 1132 on the other side of the partition 113 and corresponding to each tray slot 112, and the power transmission sockets 1132 are respectively and electrically coupled to the power supply sockets 1131.

Each power supply device 2 is plugged into each respective power slot 111, and an end of each power supply device 2 is electrically coupled to each respective power supply socket 1131.

Figure 4:
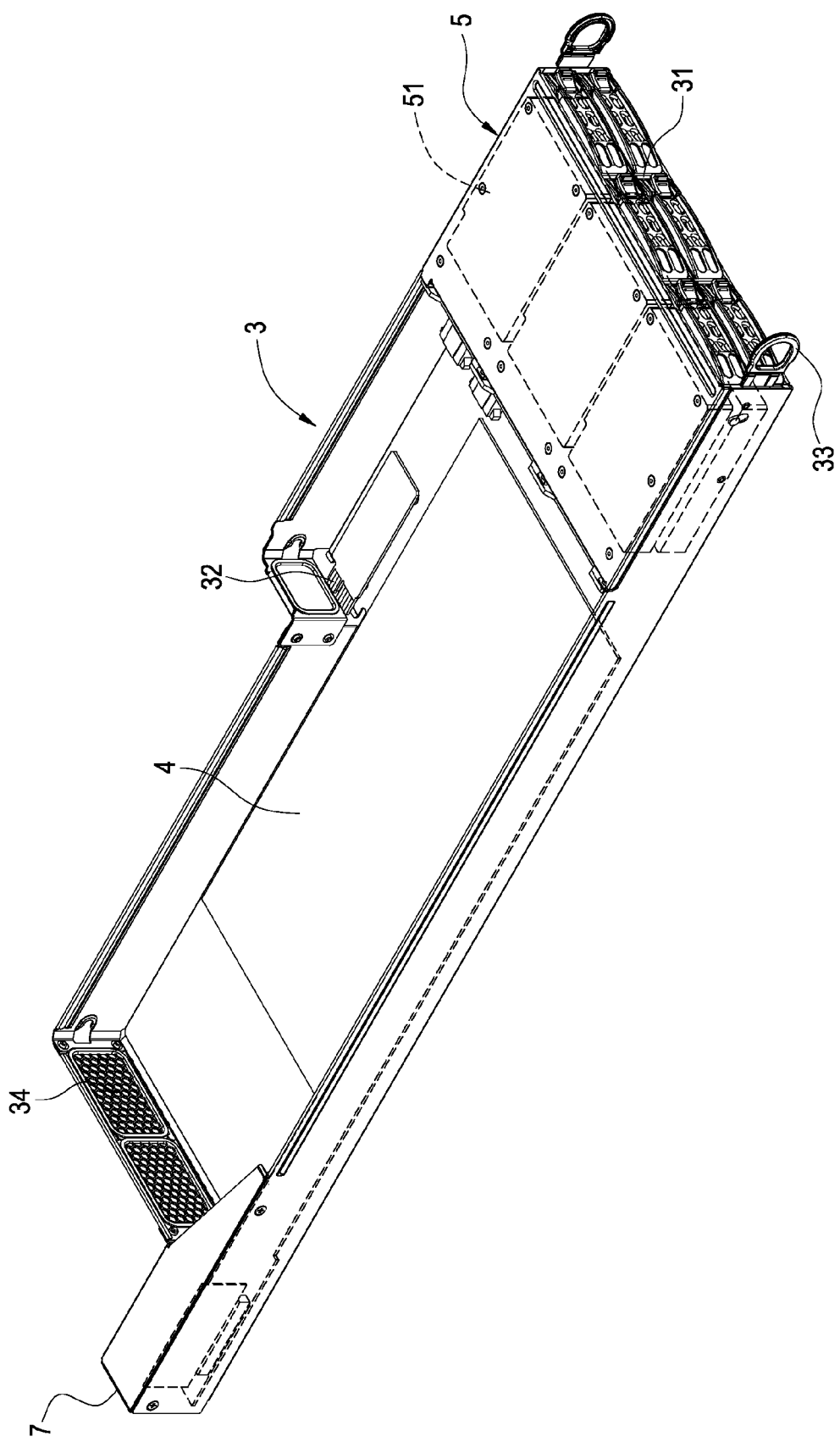
FIG. 4 is a perspective view of a motherboard tray of the present invention.
Figure 6:
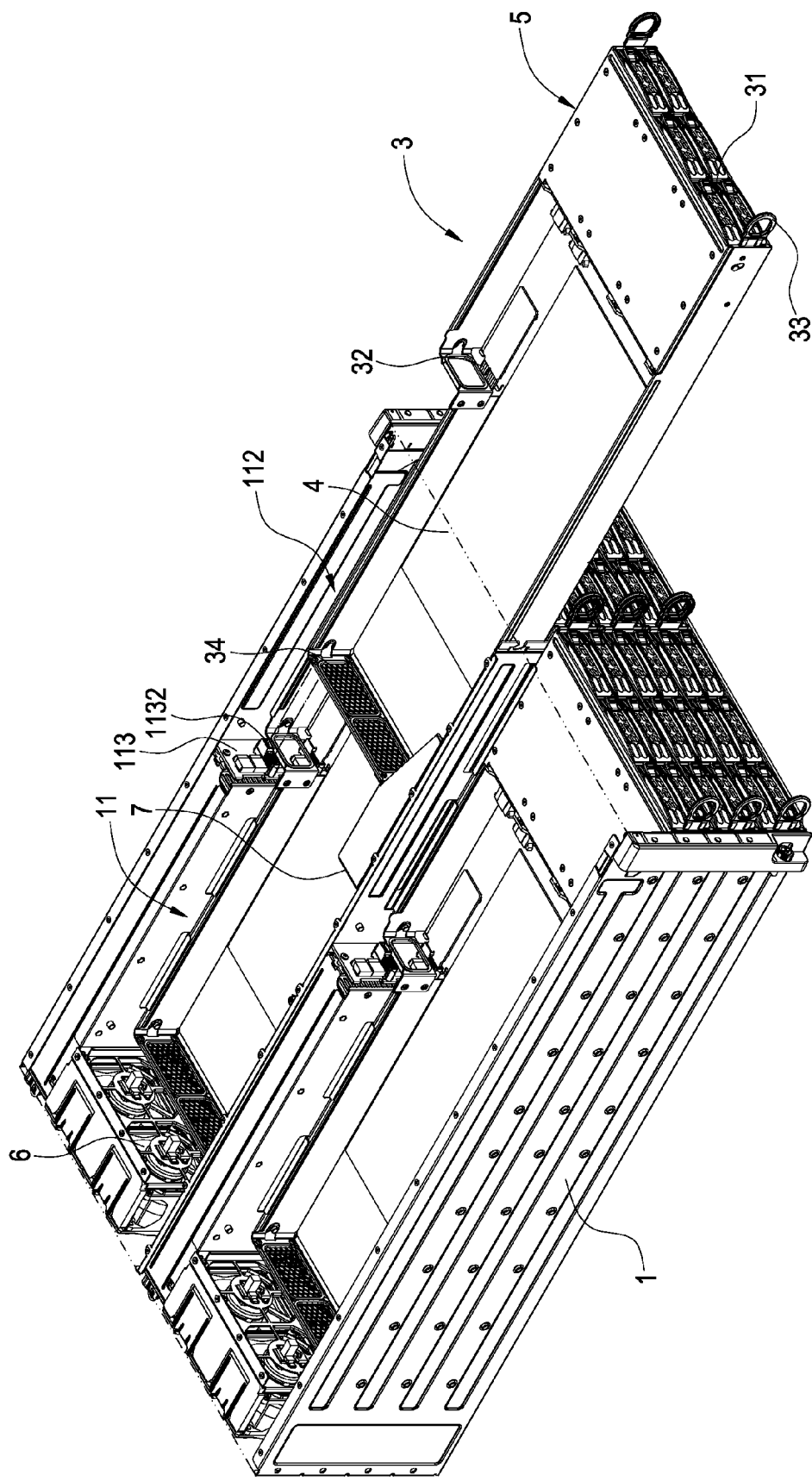
FIG. 6 is another perspective view of a server structure of the present invention.

Each motherboard tray 3 has the same shape and a motherboard 4 installed thereon, and each motherboard tray 3 has an opening 31 and a storage unit set 5 installed through the opening 31, and each motherboard tray 3 is plugged into each respective tray slot 112, and the motherboard 4 and the storage unit set 5 are respectively and electrically coupled to the power supply devices 2, wherein each motherboard tray 3 can be swapped and plugged into any one of the tray slots 112; each storage unit set 5 includes six 2.5-inch hard disks 51, but the invention is not limited to such arrangement only; and each motherboard tray 3 has a port 32 electrically coupled to the power transmission socket 1132. In FIG. 4, each motherboard tray 3 has a flexible pulling ring 33 disposed separately on both sides of the opening 31. In FIG. 6, the two flexible pulling rings 33 on both adjacent sides of the motherboard trays 3 are parallel to each other, and each motherboard tray 3 has a ventilation slot 34.

The present invention further includes two fans 6, and each fan 6 is installed at a rear section of the chassis housing 1 and arranged parallel to the power slot 111. Since the two motherboard trays 3 are stacked, the two ventilation slots 34 are also overlapped with each other, and the fan 6 is stacked to the two ventilation slots 34. In this preferred embodiment, each fan 6 is a ventilation fan, and the fan 6 extracts air from the two ventilation slots 34 to produce airflows to dissipate the heat generated by the motherboard 4 and the storage unit set 5 from the motherboard tray 3, so as to provide a better heat dissipating effect.

Figure 5:
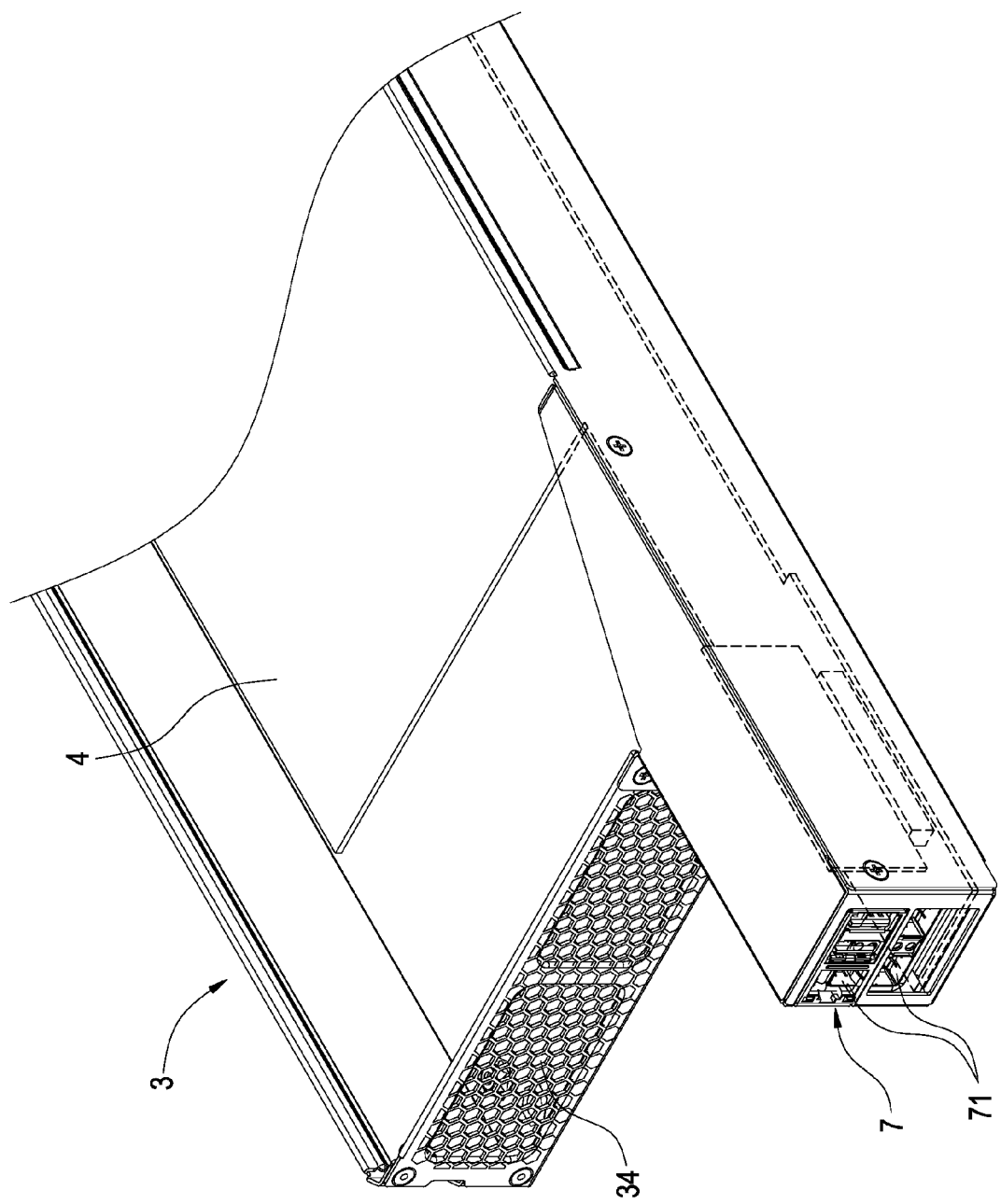
FIG. 5 is a partial close-up view of a motherboard tray of the present invention.

The present invention further comprises a plurality of detachable I/O socket bases 7 as shown in FIGS. 4 and 5, and each detachable I/O socket base 7 has a plurality of I/O slots 71, and each detachable I/O socket base 7 is installed on each motherboard tray 3 and plugged in the motherboard 4, and each detachable I/O socket base 7 is arranged correspondingly parallel to the fan 6, so that the I/O slots 71 are exposed from the chassis housing 1.

The assembly of the present invention adopts a chassis housing 1 having at least two parallel motherboard areas 11, wherein each motherboard area 11 has the power slot 111 formed at a rear section of each motherboard area 11 and the tray slots 112 formed a front section of each motherboard area 11, and the power slots 111 are formed separately at the same position of each motherboard area 11, and a partition 113 is formed between the power slots 111 and the tray slots 112, and both sides of the partition 113 have the power supply sockets 1131 electrically coupled to the power transmission sockets 1132. Each power supply device 2 is plugged into each respective power slot 111, and an end of each power supply device 2 is electrically coupled to each respective power supply socket 1131. Each motherboard tray 3 has the same shape and an opening 31 exposed from the chassis housing 1, and each motherboard tray 3 further includes a motherboard 4 and a storage unit set 5 installed thereon, and the storage unit set 5 is installed at a position corresponding to the opening 31. The motherboard 4 and the storage unit set 5 are installed on the motherboard tray 3, such that the motherboard 4 and the storage unit set 5 have a hot swap function. The mutually support systems such as the power supply device 2 and the fan 6 can be shared, so that the industrial computer can maintain a normal operation of its hardware components, even though the industrial computer is usually turned on for a long time. In addition, the hardware components of the industrial computer can be maintained, repaired, changed without turning off the industrial computer.

In addition, the power slots 111 are formed separately at the same position of each motherboard area 11, and each motherboard tray 3 has the same shape, so that the manufacturing cost can be lowered by using a same mold for manufacturing the motherboard trays 3. In the meantime, each motherboard tray 3 can be swapped and plugged into any one of the tray slots 112, and the motherboard 4 and the storage unit set 5 are respectively and electrically coupled to the power supply devices 2 as shown in FIG. 6, and each motherboard tray 3 can be plugged selectively into a left, right, upper and lower tray slot 112, and the motherboard tray 3 includes and integrates a hard disk area 51, and a standard interface is provided for coupling the power supply device 2, so as to allow users to change the design specification of the motherboard tray 3 freely according to different application requirements and plug the motherboard tray 3 at any position to achieve the swappable tray structure. Manufacturers can increase or decrease the quantity of the servers and change the position of the server to facilitate customers to manage the types of servers, so as to improve the functionality and convenience of the server structure of the present invention.

Figure 7:
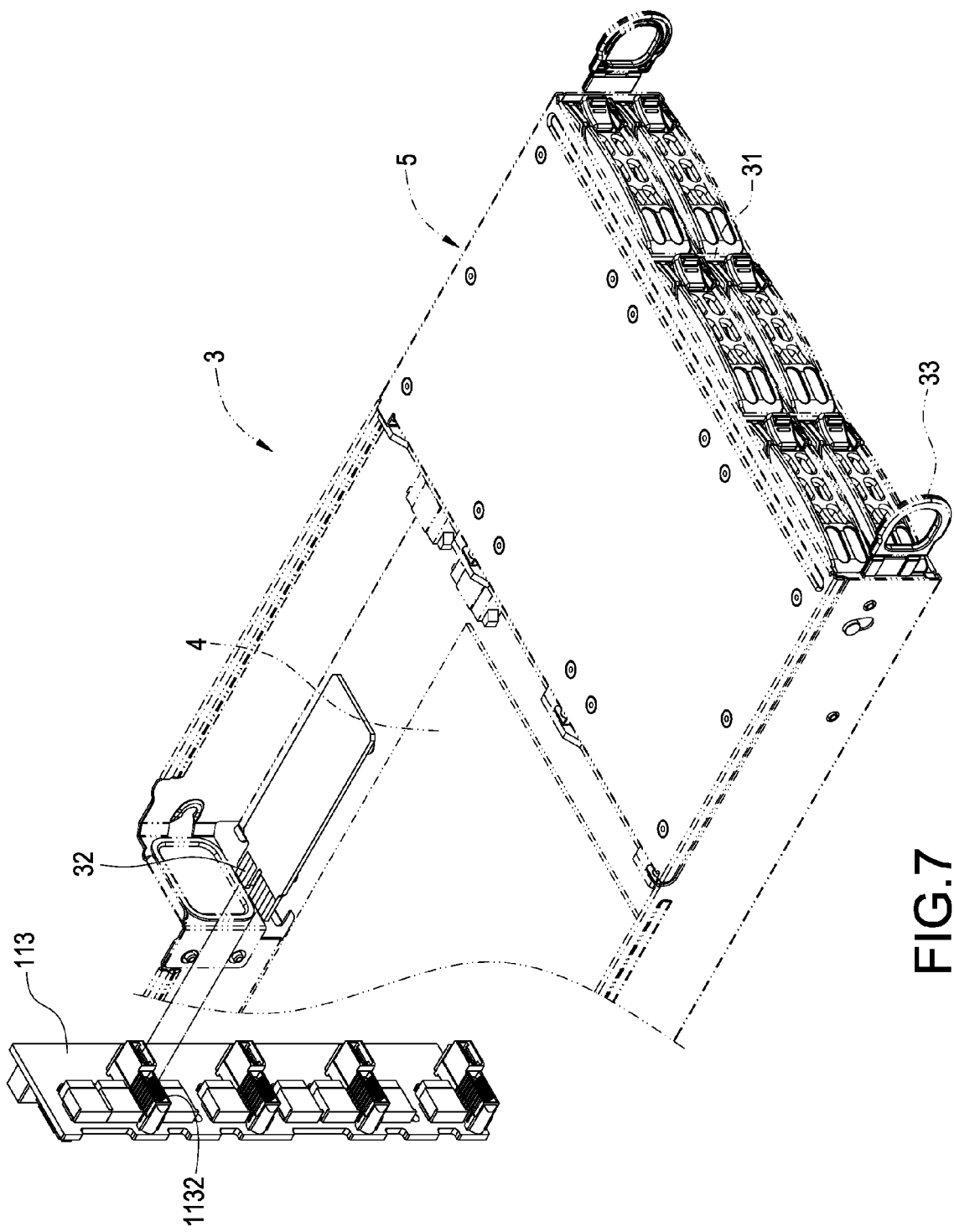
FIG. 7 is another partial close-up view of a server structure of the present invention.

In FIG. 7, each storage unit set 5 is installed at an opening 31 of the motherboard tray 3 to facilitate manufacturers to install, change, maintain or repair the storage unit set 5. In the meantime, each storage unit set 5 includes six 2.5-inch hard disks 51, so that the server structure of the present invention has the feature of a large storage space.

In addition, each motherboard tray 3 has a detachable I/O socket base 7 installed thereon, and each detachable I/O socket base 7 is parallel to the corresponding fan 6, such that the I/O slots 71 are exposed from the chassis housing 1 to enhance the expandability of the server structure of the present invention.

Figure 8:
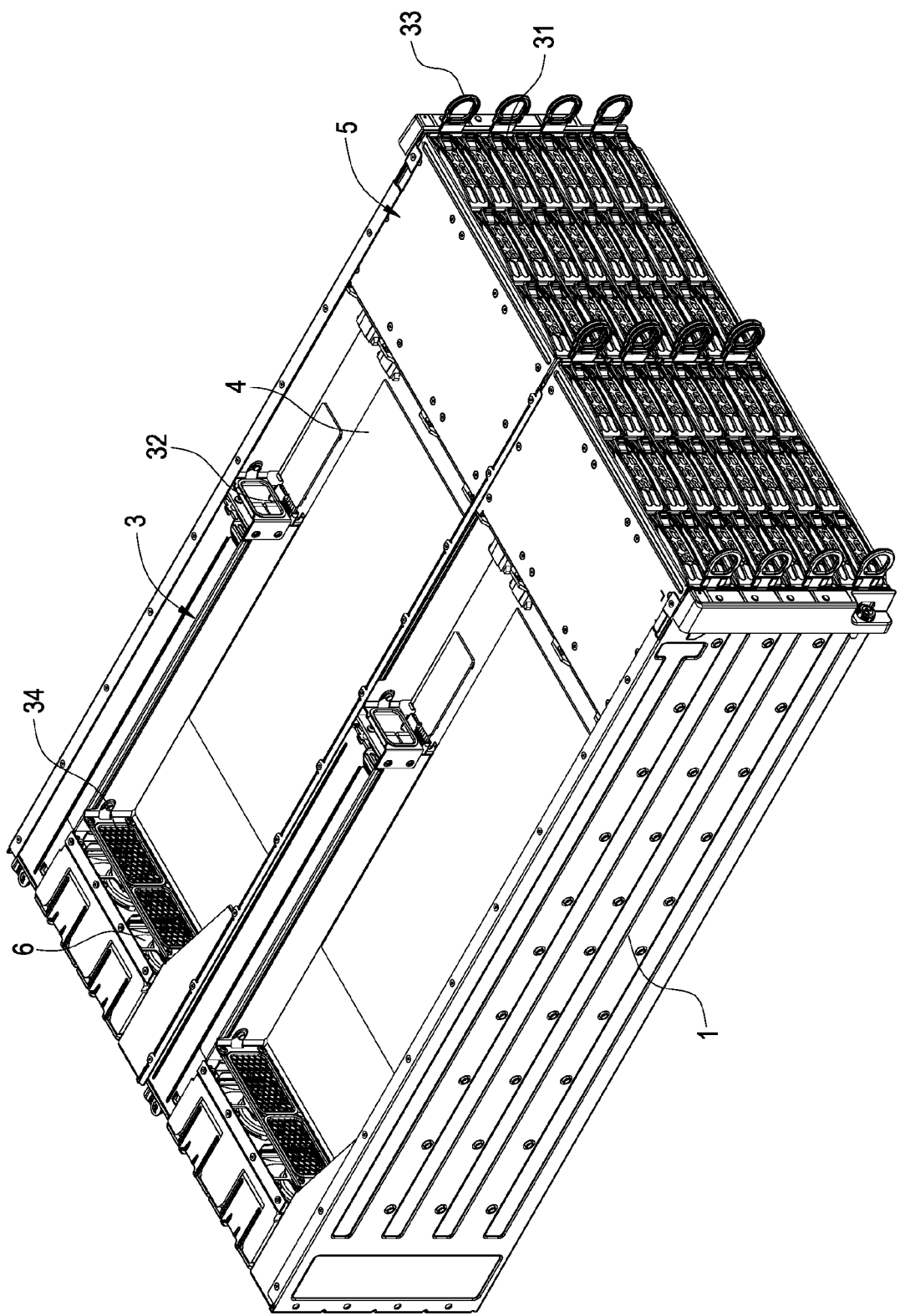
FIG. 8 is a further perspective view of a server structure of the present invention.

In FIG. 8, the flexible pulling rings 33 formed on both adjacent sides of the two motherboard trays 3 are arranged parallel to each other, so that the flexible pulling rings 33 are close to each other and cannot be pulled out easily. In this embodiment, the flexible pulling ring 33 is made of rubber, so that it can be pulled out from the tray slot 112 easily and conveniently to enhance the convenience of using the server structure of the present invention.

In summation of the description above, the present invention can achieve the expected effects, overcome the drawbacks of the prior art, and complies with the patent application requirements, and thus is duly filed for patent application.

While the invention has been described by means of specific embodiments, numerous modifications and variations could be made thereto by those skilled in the art without departing from the scope and spirit of the invention set forth in the claims.

What is claimed is:

1. A server structure with a swappable tray, comprising:
a chassis housing having a first sidewall, a second sidewall and a third sidewall disposed between the first sidewall and the second sidewall, the third sidewall dividing the chassis housing into two parallel duplicated motherboard areas, the first sidewall and the third sidewall defining one of the two parallel duplicated motherboard areas, the second sidewall and the third sidewall defining the other of the two parallel duplicated motherboard areas, each motherboard area being provided with a power slot formed at a rear section of each motherboard area and a plurality of tray slots formed at a front section of each motherboard area, wherein one of two power slots is adjacent to the first side wall and the other of the two power slots is adjacent to the third side wall, so that each of the two power slots is formed at the same position of each of the two motherboard areas; two power supply devices, plugged into the two power slots from a rear direction respectively, and a plurality of motherboard trays having the same shape, each having a motherboard installed thereon, an opening formed on the motherboard tray and a storage unit set installed through the opening, and each of the motherboard trays being plugged into each of the corresponding tray slots from a front direction opposite to the rear direction, and the motherboard and the storage unit set being electrically and respectively coupled to the power supply device; wherein each of the motherboard trays can be swapped and plugged into any one of the tray slots.

2. The server structure with a swappable tray as recited in claim 1, wherein each of the motherboard trays has a flexible pulling ring formed on both sides of the opening separately.

3. The server structure with a swappable tray as recited in claim 2, wherein the flexible pulling rings formed on both adjacent sides of the two motherboard trays are arranged parallel to each other.

4. The server structure with a swappable tray as recited in claim 1, wherein each motherboard area is further provided with a partition formed between the power slot and the tray slots, the partition having a power supply socket and a plurality of power transmission sockets formed thereon, wherein the power supply socket is provided on a first side of the partition corresponding to a side of the power slot, and the power transmission sockets are provided on a second side, opposite to the first side, of the partition corresponding to a side of the tray slots, and wherein for the partition, the transmission sockets electrically coupled to the power supply socket.

5. The server structure with a swappable tray as recited in claim 4, wherein the power supply device and the power supply socket are electrically coupled with each other, and each of the motherboard trays has a port to which each of the power transmission sockets is electrically coupled.

6. The server structure with a swappable tray as recited in claim 1, wherein each of the storage unit sets includes six 2.5-inch hard disks.

7. The server structure with a swappable tray as recited in claim 1, further comprising two fans, each being installed at a rear section of the motherboard area and parallel to the adjacent power slot, and each of the fans being a ventilation fan.

8. The server structure with a swappable tray as recited in claim 7, wherein each of the motherboard trays has a ventilation slot formed at a position corresponding to the fan.

9. The server structure with a swappable tray as recited in claim 8, wherein the motherboard trays in each motherboard area are stacked with each other, and the fan is installed to corresponding stacked ventilation slots.

10. The server structure with a swappable tray as recited in claim 7, further comprising a plurality of detachable I/O socket bases, and each of the detachable I/O socket bases having a plurality of I/O slots, and each of the detachable I/O socket bases being installed onto each of the motherboard trays, and each of the detachable I/O socket bases corresponding to the fan being arranged in parallel with each other, so that the I/O slots are exposed from the chassis housing.

* * * * *